(12) United States Patent
Schwenck et al.

(10) Patent No.: US 7,296,299 B2
(45) Date of Patent: Nov. 13, 2007

(54) TAMPER-EVIDENT AND/OR TAMPER-RESISTANT ELECTRONIC COMPONENTS

(75) Inventors: Gary Schwenck, Rochester, NY (US); Mark Corio, Rochester, NY (US); Jim Colton, Pittsford, NY (US); Keith Alexander Harrison, Woodcroft Chepstow Monmouthshire (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 857 days.

(21) Appl. No.: 09/897,424

(22) Filed: Jul. 3, 2001

(65) Prior Publication Data

US 2003/0009684 A1    Jan. 9, 2003

(51) Int. Cl.
*G06F 21/00*    (2006.01)
(52) U.S. Cl. .......................... 726/34; 174/521
(58) Field of Classification Search ................ 713/193; 174/52.2, 52.3, 521; 726/34
See application file for complete search history.

(56) References Cited

U.S. PATENT DOCUMENTS

| 4,262,329 | A | | 4/1981 | Bright et al. |
| 4,799,258 | A | | 1/1989 | Davies |
| 4,860,351 | A | * | 8/1989 | Weingart ................ 713/194 |
| 5,117,457 | A | * | 5/1992 | Comerford et al. ........ 713/194 |
| 5,136,647 | A | | 8/1992 | Haber et al. |
| 5,389,738 | A | * | 2/1995 | Piosenka et al. .......... 174/52.4 |
| 6,263,438 | B1 | * | 7/2001 | Walker et al. ............ 713/178 |

FOREIGN PATENT DOCUMENTS

| EP | 0422757 A2 | 4/1991 |
| EP | 0624014 A2 | 11/1994 |
| EP | 0860882 A2 | 8/1998 |
| EP | 0972632 A1 | 1/2000 |
| FR | 2 593 950 | 2/1986 |
| WO | 92/12485 | 7/1992 |

* cited by examiner

*Primary Examiner*—Kambiz Zand
*Assistant Examiner*—Andrew L Nalven

(57) ABSTRACT

A tamper-evident and/or tamper-resistant electronic module comprising an electronic component embedded in an encapsulant material and at least one thin sheet of frangible material contacting and overlying said encapsulant material and overlying said component, said sheet being sufficiently thin that it is likely to crack or break if an attempt is made to drill or cut through it with a laser drill.

10 Claims, 5 Drawing Sheets

TAMPER-EVIDENT AND/OR TAMPER-RESISTANT ELECTRONIC COMPONENTS

TECHNICAL FIELD

This invention relates to tamper-evident and/or tamper-resistant electronic components, and to ways of making them, and to applications for such components. It is especially, but not exclusively, concerned with electronic components which store or provide data or information.

Tamper-evident means that it is possible to tell that an attempt to subvert the electronic component, to tamper with it, has been made, preferably that it is relatively easy to tell that a tamper attempt has been made. The attempt to tamper may or may not be successful: but a tamper-evident device will have its integrity questioned if it shows signs of tampering. Tamper-resistant means that the component is difficult to tamper with, or that it has been designed to resist tampering in at least one way. Neither tamper-evident nor tamper-resistant mean that a component cannot be tampered with.

The invention has arisen out of the area of timestamping an electronic document with a time in such a way that there is a high degree of confidence that the document was really timestamped at the indicated time and that the time has not been forged. Since the invention arose from such considerations it will be described in that context, but it will be appreciated that it has wider applicability to other areas where it is desired to provide a tamper-evident and/or tamper-resistant component, circuitry, or device.

BACKGROUND ART

It is known in the field of timestamping documents to send a digest or fingerprint of document to be timestamped over the Internet to a Trusted Clock—a clock whose integrity can be relied upon (for example relied upon in a court of law). The Trusted Clock then timestamps the digest, cryptographically digitally signs the digest (for example by producing a hash or second digest of the document digest plus time stamp and then encrypting it) and sends the signed and hashed fingerprint or document/digest, back over the Internet to the person who requested that the digest be signed. The signing process typically involves encrypting data, often using the PKI infrastructure. Thus the signature, and the evidential reliability of the document and timestamp are time-limited to when the cryptographic keys time expire in reliability (the Certification Authority typically puts a limit on the time for which they say their keys are safe, before they cannot be certain enough that someone could not decrypt encrypted messages without the key). This may result in the need to have a timestamped signed digest timestamped and signed again, using newer encryption keys before the expiry of the older encryption certificate keys.

This need, and the general rise in Internet traffic, and the rise and projected rise in the requirement to timestamp documents or digests of documents with a reliable time, means that there is likely to be increasingly large demands on the Internet telecommunication pathways, and upon the usage of Trusted Clocks.

Documents or digests of documents that are timestamped need not be share trades, tenders for tendered work, or other "high level" sensitive document digests, but are increasingly more mundane things such as a digest of the log of when a monitored door is opened and closed, and who opened and closed it (eg secure doors requiring swipe cards or other user identification means). Connecting a door sensor/actuator to the Internet can be expensive and awkward, as can connecting other sensor/or control devices to the Internet.

It is known for people to try to determine the structure and operational capabilities, and software used, in someone else's microchip, or printed circuit board (PCB) in order to break the law, for example in order to bypass security provisions in order to perpetrate criminal activities such as industrial espionage, or even fraud or theft. Internet fraud and computer hacking are growing problems. Bank fraud and the breaching of the security of computer systems are growing problems. In some cases changing the time on an electronic record, e.g. putting the clock back, can be used in fraud. For example such "spoofing" of systems can mislead third parties into trusting something they should not trust. It is undesirable to have anyone subverting the function of an electronic device in an undetected manner.

It is known to encase microchips, PCB's or other electronic devices in a polymer matrix to hinder their physical inspection. It is known to shield electronic components electromagnetically in order to prevent the leakage of electromagnetic radiation out from a device (the leaking out of information), and to prevent a device being subjected to incoming e.m. radiation, e.g. probing a device with a prompt and seeing what its responses are, in order to deduce things about the device.

DISCLOSURE OF THE INVENTION

It is an aim of at least one embodiment of the invention to reduce the need for Internet usage in order to access a Trusted Clock.

It is an aim of at least one embodiment of the invention to provide a tamper-evident and/or tamper-resistant electronic component.

It is an aim of another embodiment of the invention to provide a Trusted Clock, or a Trusted data store.

According to one embodiment the invention comprises a tamper-evident and/or tamper-resistant electronic module having an electronic component, an encapsulant, and a tamper-evident tell-tale, the electronic component being embedded in the encapsulant and the encapsulant being associated with the tell-tale, and wherein the tell-tale is adapted to have a normal condition and a compromised condition and is adapted to undergo a one-way change from its normal condition to its compromised condition if it experiences physical conditions that are outside of allowable operational conditions, the compromised condition of the tell-tale being detectably different from the normal condition of the tell-tale; and wherein the change in condition of the tell-tale is causeable by at least one of: (i) light levels that are higher than an allowable intensity; (ii) a thermal gradient in said tell-tale above a permissable level; (iii) the temperature of the tell-tale rising above a permissable level; or (iv) mechanical stress in the tell-tale being above a permissable level.

Thus if the tell-tale is exposed to undesirable conditions it is possible to determine this after the event. Preferably the tell-tale has its compromised condition such that the difference between compromised and normal conditions can be identified readily by the naked eye.

Preferably the tell-tale comprises a thin sheet of frangible material which cracks or breaks when exposed to the non-permissable physical conditions. The tell-tale may comprise a sheet of glass, preferably untoughened glass, preferably pre-stressed glass adapted to break into many pieces, or have many cracks, if it experiences impermissable conditions. A surface, possibly a generally planar surface of the electronic component may be protected by a unitary or single sheet of frangible material, at least at a certain distance from the component.

Preferably the tell-tale is adapted to indicate an attack on the module by a laser beam. Preferably the tell-tale is adapted to fracture if a laser beam powerful enough to drill through the encapsulant is directed onto it.

The module may comprise a tamper-resistant element. The tamper-resistant element may be the tamper-evident tell-tale.

Preferably the encapsulant is an optically absorbing colour, such as black. The encapsulant may be a solid material, such as a solidifiable polymer. A suitable material is epoxy polymers.

The sheet of frangible material may be coloured, for example it may be a dark colour. The sheet of frangible material may have a thickness of about $3/1000$ of an inch. The sheet thickness may be: less than $1/1000$ of an inch; about $1/1000$ of an inch or less, $5/1000$ of an inch or less, $1/100$ of an inch, $3/100$ of an inch, $5/100$ of an inch, $10/100$ of an inch, $20/100$ of an inch or more, or within a range defined between any two points in the aforesaid list. A thickness in a range of $1/1000$ to $10/1000$ of an inch is preferred, most preferably $3/1000$ inch $\pm 2/1000$ inch, or $3/1000$ inch $-8/1000$ inch.

The encapsulant may be in the form of a layer, which layer may have a depth that is about, or at least, 2, 5, 10, 50, 100, 500, or more, times thicker than a tell-tale sheet.

Preferably the tell-tale sheet extends over substantially the whole of the plan area of the electronic component. Preferably there is tell-tale above and below the electronic component, and preferably to substantially all sides of it.

The electronic component may be a printed circuit board (PCB). The module may comprise a generally flat elongate body, which may be generally rectangular. There may be a PCB, or other electronic component, sandwiched between layers of encapsulant, which encapsulant layers are themselves sandwiched between tell-tale layers. The tell-tale layers are preferably frangible sheets, preferably of glass, and a single frangible sheet may extend over substantially the whole of the plan area of the component/PCB.

The tell-tale sheet(s) may have a diffusive structure adapted to hinder the transmission of a focused, collimated, laser beam. The diffusive structure may comprise a roughened, non-smooth, layer. This may be an etched, ground, or frosted layer or surface. Such layers can diverge or scatter a parallel laser beam, reducing the energy density in the encapsulant, and possibly increasing the heating in the tell-tale layer. Such diffusive capability comprises tamper-resistance.

The tell-tale sheet may have a mirror or reflective surface. This may reflect a laser beam, or substantially reflect it, thereby reducing the intensity of light that reaches the encapsulant, and possibly increasing the heating in the tell-tale layer. This may be both tamper-resistant and enhance tamper-evidence.

The mirrored or reflective surface and/or the diffusive surface need not necessarily be part of the frangible sheet. They could be provided on other structures, preferably underlying the frangible sheet.

The electronic component, or PCB, may comprise a clock. The tamper-evident and/or tamper-resistant module may comprise a Trusted Clock.

The module may have an overlayer of masking material covering the tell-tale. The masking material may comprise an encapsulant, possibly of the same material as that which contacts the electronic component.

The encapsulant and/or masking material may have an identifiable chemical, or physical, signature, possibly due to the addition of signature compounds or microparticles: the addition of signature material. This can make it difficult for someone to remove the encapsulant or masking material, compromise the electronic component, and apply new masking material or encapsulant. They would have to match the material signature closely enough to fool chemical and/or physical analysis for this to be undetectable.

According to a second aspect the invention comprises a computing device having a tamper-evident and/or tamper-resistant module in accordance with the first embodiment of the invention.

Preferably the computing device is from the group: PC; server. Preferably the tamper-evident and/or tamper-resistant module comprises a trusted clock.

Instead of a continuous sheet of frangible material there could be a serpentine, meandering, or convoluted path which may be broken if it is hit with a laser or drill. This may be a path doped into a carrier sheet (eg of silica, silicon or glass). Instead of being able to detect an attack visually using the unaided eye, the integrity of the tell-tale layer could be established by monitoring in some other way, for example by passing light or electricity along a pathway and detecting if the pathway is damaged or not present. Visual inspection is the preferred option.

According to another aspect the invention comprises a method of detecting that an attempt to compromise an electronic component has been made comprising protecting the electronic component with a thin sheet of frangible material, the sheet being sufficiently thin that it cracks or breaks if an attempt to drill through it or cut through it is made.

Preferably the method comprises using a thin sheet of glass to indicate tampering. Preferably the method comprises using glass that is thin enough and stressed enough to shatter if it is stressed beyond a permissable level.

The method may comprise using a diffusive material to protect the component from a laser beam, the diffusive material in use diverging a laser beam so as to reduce the spatial energy intensity.

The sheet of frangible material may be treated so as to cause it to be diffusive. The treatment may be from the list: etching, grinding, roughening.

The method may comprise using a reflective surface to protect the electronic component from a laser beam attack. The reflective surface may be associated with the frangible sheet, e.g. coated on it. The frangible sheet may have a reflective surface and a diffusive surface. The method may comprise covering the sheet of frangible material with a masking layer.

According to another aspect the invention comprises a method of providing a trusted data output from a trusted electronic component, the method comprising: providing a tamper-evident and/or tamper-resistant electronic module in accordance with the first aspect of the invention and checking that said module has not been tampered with, the data output from said module during the period when the module has not been tampered with comprising trusted data.

Preferably the method comprises providing a trusted clock module as the tamper-evident and/or tamper-resistant module and the trusted data comprises a timestamp.

According to another aspect the invention comprises a method of timestamping a document, digest of a document, or data comprising using a tamper-evident and/or tamper-resistant trusted clock module in accordance with the first aspect of the invention.

According to another aspect the invention comprises a method of manufacturing a tamper-evident and/or tamper-resistant electronic module comprising the steps of taking an electronic component and at least one sheet of frangible material that is sufficiently thin that it is likely to crack or break if an attempt is made to drill or cut through it with a laser drill when said module is made, and encapsulating said component and said sheet in encapsulant material.

The encapsulant may be a dark colour (e.g. black, blue, red) and the method includes the step of obscuring from view said sheet with encapsulant.

According to another aspect the invention comprises a sheet of frangible material for use in providing tamper-evidence and/or tamper resistance, said sheet having a diffusive layer adapted in use to diffuse a laser beam, and also a reflective layer adapted in use to reflect a laser beam.

Preferably the sheet is a sheet of glass having a thickness of not more than about 5/100 inch and having an etched surface comprising said diffusive layer, and a metallised surface comprising said reflective layer.

BRIEF DESCRIPTION OF THE DRAWINGS

Embodiments of the invention will now be described by way of example only, with reference to the accompanying drawings, of which.

DETAILED DESCRIPTION OF THE INVENTION

Figure 1:
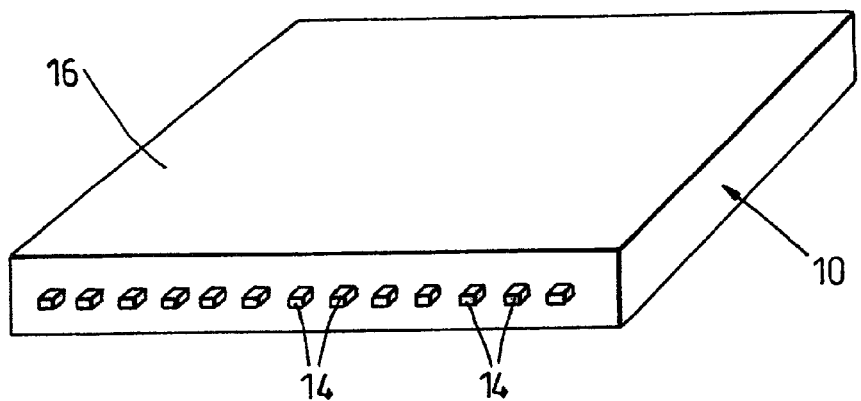
FIG. 1 shows a tamper-evident electronic data storing or data providing device in accordance with the invention.
Figure 2:
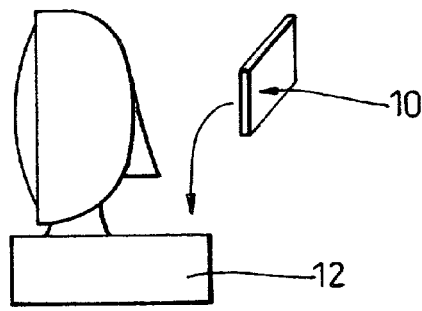
FIG. 2 shows the device of FIG. 1, in this example in the form of a PCI card, or card-equivalent, being introduced into a PC.

FIG. 1 shows a Trusted Clock PCI card 10 for a computer, such as a personal computer 12 shown in FIG. 2. The card 10 is a half-width PCI card having a plurality of connectors 14 projecting from a glass-clad polymer matrix body 16.

Figure 3:
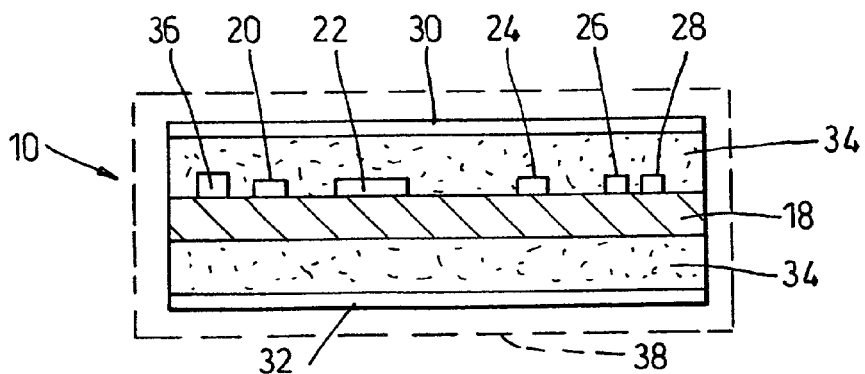
FIG. 3 shows schematically a PCB protected using the present invention.

The card 10 is about 6 inches×4 inches×½". It has, as shown in FIG. 3, a printed circuit board 18 which carries electronic components such as clock-associated microprocessors 20, 22, a battery 24, and assault sensors 26 and 28. The card 10 also has a thin glass upper sheet 30 and a thin glass lower sheet 32. The glass of the sheets 30 and 32 is untoughened stressed glass which cracks or shatters when subjected to too much stress or strain. The glass sheets 30 and 32 are in this example about 3/1000 of an inch thick and face the polymer matrix body 16, with the glass and polymer matrix in intimate face to face contact. The body 16 is made of a black epoxy polymer material 34 such as may be commonly used in the electronics industry as an adhesive for electronic components. The matrix material 34 of the body 16 carries a chemical marker or signature: a substance present, often added specifically, to aid recognition of the matrix material in tests. More than one chemical marker may be present in the matrix material.

The PCB 18 also carries a digital signer chip 36, or the chips 20, 22 can provide a digital signature function.

In use of the card 10 the computer 12 sends via the connectors 14 a digest, hash, or fingerprint of a document to be timestamped to the card 10, (which document may itself be a hash or digest of a larger document) and the clock chips 20, 22 associate a time derived from their clock function with the document, and the digital signer 36 signs the timestamped document digest. The signed timestamped document digest, or hash, may be stored on a memory chip (not shown) on the PCB, and/or may be output back to the PC via the connectors 14, preferably after first being encrypted.

The clock of the PCI 10 cannot be altered either (i) at all, or (ii) by unauthorised instructions. The PCI is tamper-evident because of its thin glass sheets. If the veracity of the timestamp applied to documents by the PCI 10 is to be established a trusted person, who may be the supplier of the PCI card, physically inspects the card for signs of tampering.

One way of tampering with a PCB or PCI card is to drill into the PCI card and interfere with the circuitry and/or chips on the card. Drills which could be used include mechanical drills, laser beams, and ion beams.

The inspecting person looks for signs of discoloration, cracking, or damage to the glass sheets 30 and 32. If an optical laser drill is used the laser beam initially passes straight through the optically clear glass sheet 30 or 32, but strikes the optically absorbent matrix material 34 (usually black or other dark colour such as brown, blue, red, etc.) which is in physical and thermal contact with the glass sheet over their interface. The matrix material gets hot as it is burned away by the laser beam and heat is conducted into the glass sheet. The sudden and sharp temperature change in a localised region of the glass sheet causes thermal stress and causes the glass sheet 30 or 32 to shatter or crack, or at least be marked, thereby rendering the device visibly distinct from unattacked devices.

A further physical effect which causes cracking of the glass is that as the matrix material 34 is vaporised by the laser beam a plasma or gas is produced which exerts a pressure on the glass above it, and this pressure can break, crack, or mark the glass: it need not be the thermal shock that is the cause of the glass breaking.

The PCI card 10 of FIGS. 1 and 3 may be as previously described with a glass sheet as its outer surface, or it may be as shown in dotted outline in FIG. 3 and may have an outer shell or layer 38 of encapsulant matrix material, such as epoxy resin matrix, probably with a chemical signature marker(s)

It will be appreciated that by encapsulating the PCI card 10 in encapsulant matrix material it is even harder for an attack on the integrity of the card to be made without it being evident afterwards. If someone uses a solvent, or other means, to remove some or all of the matrix material in a region they would have to try to replace that matrix material afterwards, and providing the new matrix material with the correct chemical signature would be very difficult. A person testing for assaults on the card 10 could take a sample, or several or many samples of matrix material from different places on the body 16 and check that they had the correct chemical signature.

Someone checking that the card 10 has not been tampered with could destroy the card in the process. Someone trying to tamper with the card undetected cannot afford to do this. In the model where the owner of the device loans the device to a customer (for payment typically), they will know which customer allowed an attack on their device to take place when they inspect the device. Customers with bad histories could be denied access to devices.

A mechanical drill attack on the glass plate 30 or 32 is also likely to fracture it/be readily detectable. Mechanical and/or thermal stresses will be set up and these can cause the glass to be visually differentiated from unstressed glass.

Figure 4:
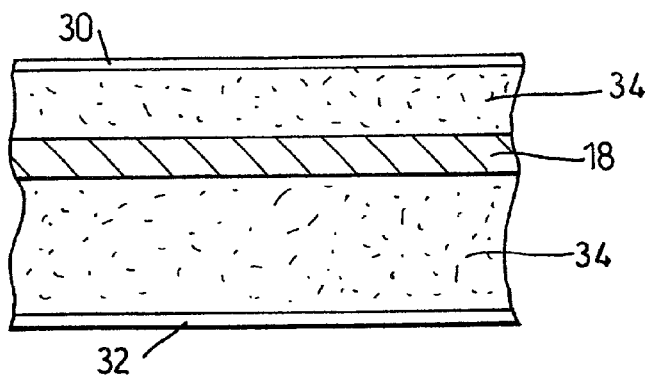
FIG. 4 shows variant similar to that of FIG. 3.

FIG. 4 shows another embodiment. In this example the PCB board 18 is asymmetrically disposed between the upper and lower glass sheets 30 and 32. This can make it more unpredictable for an attacker to determine how deep they have to drill to get to the board. The epoxy encapsulant matrix 34 is opaque and so they cannot see the board using optical light. The glass may be transparent, or coloured.

Figure 5A:
FIGS. 5A to 5F show different glass sheets that can be used in the invention.

FIG. 5A shows the sheet glass used in the embodiments of FIGS. 1, 3 and 4. This glass is about 3/1000 inch prestressed untoughened glass, with a propensity to crack, and preferably a propensity to crack a lot/shatter into many small pieces if it breaks. This can aid the immediate visual realisation that the glass has broken/been interfered with.

Figure 5B:

FIG. 5B illustrates another feature of some embodiments of the invention, and shows a sheet of pre-stressed untoughened glass 40 having a smooth surface 42 and a roughened, unsmooth, surface 44. The unsmooth surface 44 is in this example an etched surface. It may be etched using chemicals (e.g. HF acid), or mechanically (e.g. sandblasted or ground). An advantage of having an etched/rough surface is that it diffuses light, reducing the power density of any laser beam that propagates through it, and thereby reducing the effectiveness of the drilling operation of a laser beam and increasing the local heating in the vicinity of the glass/matrix interface at the region where a laser beam impacts the glass. This provides tamper-resistance, and may increase tamper-evidence.

The glass sheet 40 could be disposed relative to the PCB so as to have its diffusing surface facing the PCB (on the inside of the PCI card). This makes it impossible to grind or polish the diffusive surface flat before using a laser drill. Alternatively, the diffusive surface may be facing outwards. This may make it easier to see glass/matrix interface markings/visual signs of tampering, for example if the rough surface is polished flat during the tamper-free verification process. A tampering person may not realise that they have marked the glass/matrix interface. Again in the preferred embodiment the glass is thin enough to shatter if a laser is used to drill through matrix material beneath it.

Figure 5C:
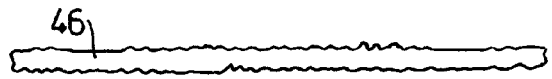

FIG. 5C shows a sheet of glass 46 which is diffusive at both of its surfaces (e.g. etched, ground, frosted, sandblasted etc).

Figure 5D:
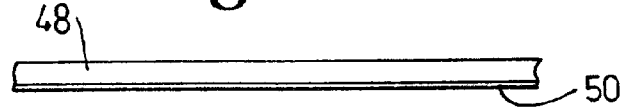

FIG. 5D shows another sheet of glass, sheet 48, which can be used in the invention. This time the glass has a mirrored surface 50. This would usually be adjacent the matrix, near to the PCB, but it could be on the outside of the glass layer, facing away from the PCB. The mirrored surface is to reflect laser light, substantially preventing the laser beam from penetrating to the encapsulant matrix material, or reducing the intensity of light that reaches the encapsulant/matrix material. This provides a degree of tamper-resistance.

Reflecting light back into the glass sheet may also cause the sheet to absorb more light, and possibly thermally expand locally, breaking or cracking the glass. This may provide greater tamper-evidence.

The sheet 48 could have a mirror coating on both of its surfaces. This may also result in the glass heating locally and/or reduce the transmission of laser light.

Figure 5E:
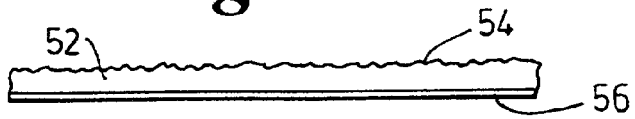

FIG. 5E shows a sheet of glass 52 which has a diffusive surface 54 on one side and a mirror coating 56 on the other side. The diffusive surface scatters, defocuses, and dissipates the intensity of an incident laser beam, and the mirror layer 56 reflects substantially all of the laser light back. These two effects make it very difficult to drill a small hole in the encapsulant matrix material, which is opaque to the laser light, beneath the glass without overheating the glass and cracking or otherwise marking it.

Figure 5F:
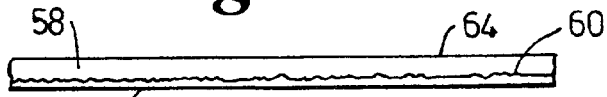

FIG. 5F shows another possibility in which a glass sheet 58 has a diffusive surface 60 which itself has applied to it a mirror coating 62. The diffusive surface can be "hidden" or protected beneath the upper surface, referenced 64, of the sheet and cannot be polished flat from the outside.

Suitable mirror finishes could be mercury based layers, or chromium-based layers, or metallic paints.

It will also be appreciated that instead of/as well as mirror layers 50, 56, 62, it is possible to have absorbent layers associated with the glass (e.g. an absorbent paint layer). These may not be necessary since the epoxy encapsulant is typically a black, optically absorbent, material. If for some reason the encapsulant matrix material were not strongly absorbent enough an absorbent layer may be provided. This could absorb laser light, get hot, and cause the glass to break.

Figure 6:
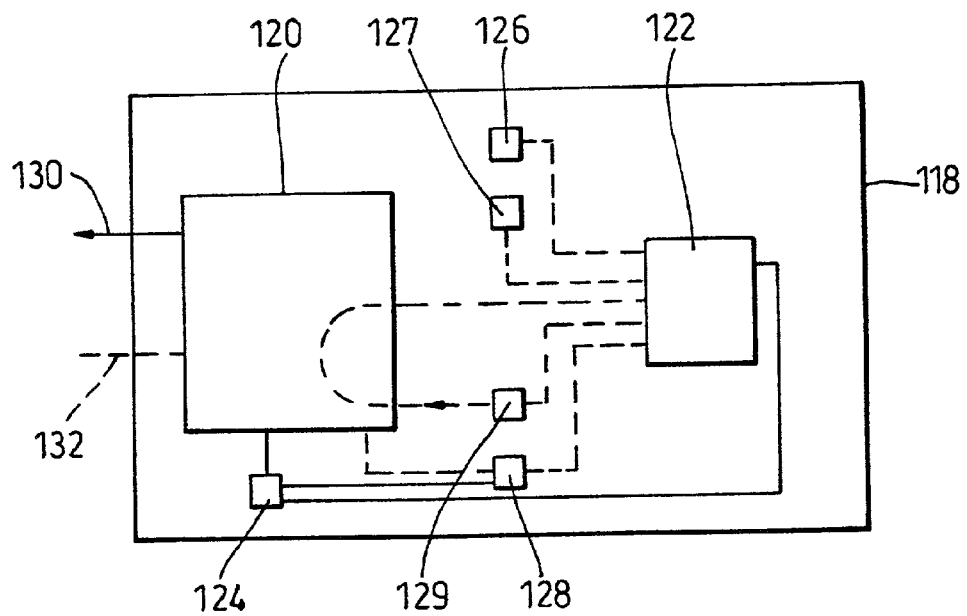
FIG. 6 shows a PCB suitable for protection using the present invention.

FIG. 6 shows details of an alternative PCB board 118 to be protected in accordance with the invention. The board 118 has a Trusted Clock chip 120, a battery 124, board interference sensors 126, 127, 128, a signal injector 129, a PIC chip 122 and an output only line 130. There are no external inputs to the PCB 118: it simply sends out a timestamp signal via line 130. It may do this periodically, e.g. once every second, or every minute, or for example, every 1/100 of a second. Alternatively there may be an input to the chip 130, referenced 132, for example in order to correct its clock for drift.

Sensor 126 is a temperature sensor, such as a thermister. This senses the temperature at the chip and either provides that to the PIC chip 122 which determines whether it is within allowable bands, or compares the signal from sensor 126 with a reference temperature signal and checks that they are close enough, within an allowable range. This can detect overheating (e.g. due to laser attack), or cooling (e.g. sub zero ° C. cooling). Sensor 127 is a vibration sensor and/or orientation sensor (possibly an electronic gyroscope) which sends signals to the chip 122 which checks if untoward vibration and/or re-orientating of the PCB has taken place. Sensor 128 is a power supply sensor which senses the power supply to the chip 120 and/or chip 122 and provides signals indicative of power supply characteristics to the chip 112 which uses them, possibly in combination with a reference power supply signal, to determine whether the power supply to chip 120 and/or itself is being altered or perturbed. Signal injector 129 generates known signals of known characteristics, and introduces them to parts of the PCB. Those known generated signals are fed back to the chip 122 where a comparator compares the injected signals with the returned signals and if the match is not what was expected this is indicative of a problem, and that the Trusted Clock may have been compromised and is unsafe. The injected signals may constitute guard signals transmitted over a guard network or guard wire where breaking the wire (e.g. with a drill) blocks the transmission of the guard signals. Alternatively or additionally the injected signals may be injected into the chip 120 itself and may be influenced by attacks on the clip 120. The injected, or guard, signals may be a fluctuating signal which changes rapidly in a known way. For example it may be a digital signal that is altered thousands of times a second.

It will be appreciated that upon detection of a non-allowable event the chip 122 may instruct the Trusted Clock chip 120 not to produce any more time signals, and/or it may emit an alarm signal, and/or it may note the event in an internal memory, a memory on the PCB, or an external memory (or it may record the event in more than one memory). The alarm signal may be transmitted via output 130, or possibly via a wireless alarm emitter provided on the PCB 118.

Figure 7A:
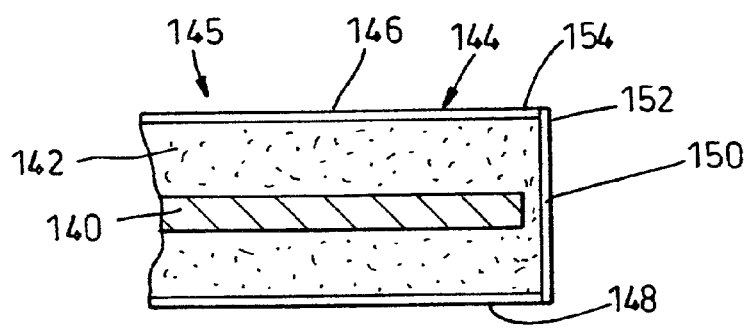
FIG. 7A and 7B schematically shows the PCB of FIG. 6 protected using the invention.
Figure 7B:
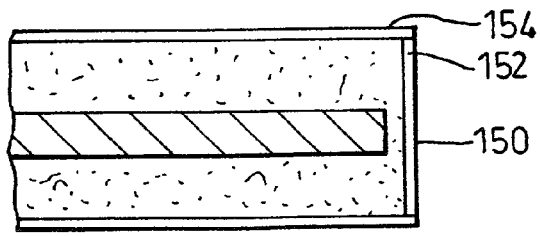

FIG. 7A shows an electronic component 140 that is to be tamper-evident-protected surrounded by an encapsulant 142, and having a sheathing 144 of thin frangible material to form a tamper-evident body 145. The sheathing 144 comprises a top sheet 146, a bottom sheet 148 and side sheets 150 (only one of which is shown). In this example edge portions 152 of the sheet 150 overlie edge portions 154 of the top and bottom sheets. In the arrangement of FIG. 7B it is the other way round: edge portions 154 of the top and bottom, main facing, sheets overlie and cover the edge portions 152 of the end/side sheets 150. Of course, the side sheets 150 could overlie the edge regions of one of the facing sheets 146, 148 and underlie the edge region of the other. It will be appreciated that the body 145 is covered at all of its surfaces with the thin frangible material. This frangible material could be glass as otherwise described, or some other material that is liable to crack or break when attacked by a drill or other cutting tool.

It will also be appreciated that although we have discussed the tamper-evident sheet material cracking to provide a visual tamper-evident signal some other tamper-evident signal could be provided instead of this, or as well as this. For example, there may be a change of colour. There may be a change of non-visual properties (i.e. visually inspecting a device to see if it has been tampered with is the preferred option, but it is not the only one). The electrical conductivity of a tell-tale structure (e.g. sheet or net) may be altered by an attempt to compromise the electronic device that is protected, or the optical transmissivity or reflectivity, or absorption characteristics of the tell-tale may be altered by the attack.

Figure 8:
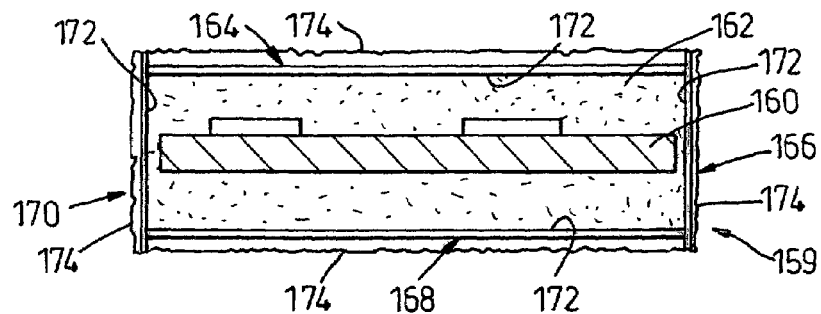
FIG. 8 shows schematically a preferred embodiment of the invention.

FIG. 8 shows a preferred embodiment of the invention in which a tamper-evident electronic component module 159 comprises a PCB 160 encapsulated in black epoxy resin 162 which is bonded to thin sheets of glass facing 164, 166, 168, 170, comprising tell-tale indicia. Each of the sheets of glass has an inner face 172 which has a mirror layer 174, and a diffusive outer surface 176 (an etched, frosted, outer surface). The module 159 may be covered with an obscuring material 176 (shown in FIG. 10), which may be expoxy material to form a block 191. For example the module shown in FIG. 8 may be encased in an opaque (e.g. black) encapsulant.

Figure 9A:
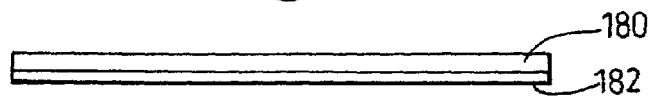
FIG. 9A to 9C shows other techniques for achieving the invention.

FIG. 9A shows schematically a sheet of glass 180 having an energy-absorbing layer 182, e.g. painted onto the glass. The energy absorbing layer absorbs energy from a laser drill and causes the glass to crack.

Figure 9B:
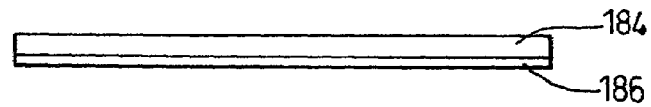

FIG. 9B shows a sheet of glass 184 associated with a photochromic layer 186 which changes colour (permanently) when exposed to light above a certain intensity. Alternatively, the layer 186 could be a thermally sensitive layer which changes colour when it gets too hot and/or cold.

Figure 9C:
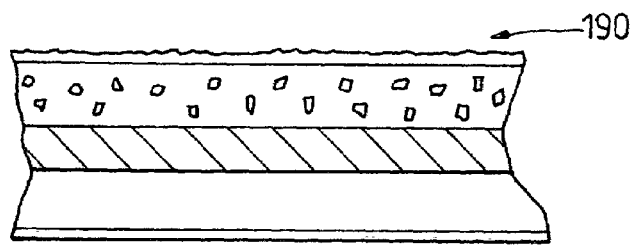

FIG. 9C illustrates an embodiment where a tamper-evident module 190 has asymmetric arrangements to either side of the electronic device being protected. In this example, one sheet of glass is frosted and the other is not.

FIG. 9C also shows another feature which can be used with other embodiments. The encapsulant material which contacts the thin sheet and the PCB could have particles 192 or other inclusions (e.g. fibres, bodies, powders etc) which are intended to reduce the effectiveness of laser drill attack, or to provide a tell-tale that an attack has taken place.

The particles 192 may comprise reflective particles, or particles which absorb energy at the expected wavelength of laser attack, or photosensitive or thermally sensitive particles which undergo a detectable change when they are illuminated by a laser or heated by a laser. The encapsulant may have more than one type of particle distributed in it.

As an alternative to glass which breaks when it gets hot/stresses are introduced, the thin sheet could melt/become plastic. It could be made of a plastics polymer material (preferably with a chemical signature) that is difficult to reproduce. The thin sheet could have a frangible layer and a non-frangible layer, breaking of the frangible layer being evident due to fringe interference effects between the two layers due to the broken layer moving away from the unbroken layer slightly. For example, there could be a frangible layer with a plastics backing film.

Figure 11:
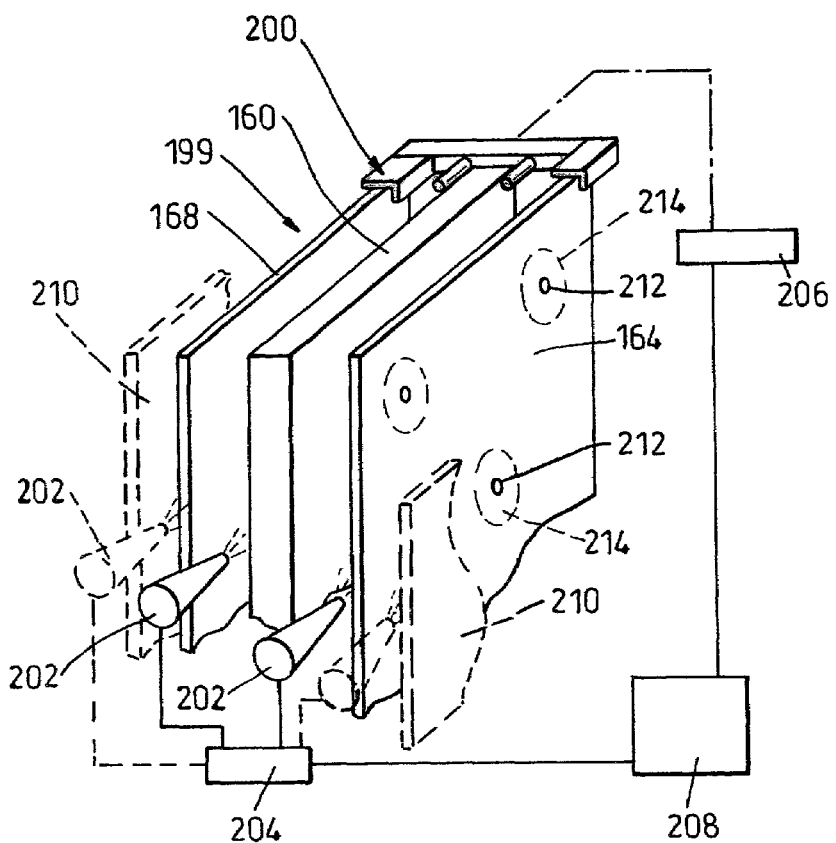
FIG. 11 illustrates schematically a way of making the embodiments of FIGS. 8 and 10, and apparatus for making them.

FIG. 11 shows a way of producing tamper-evident electronic modules, and apparatus for manufacturing them.

Figure 10:
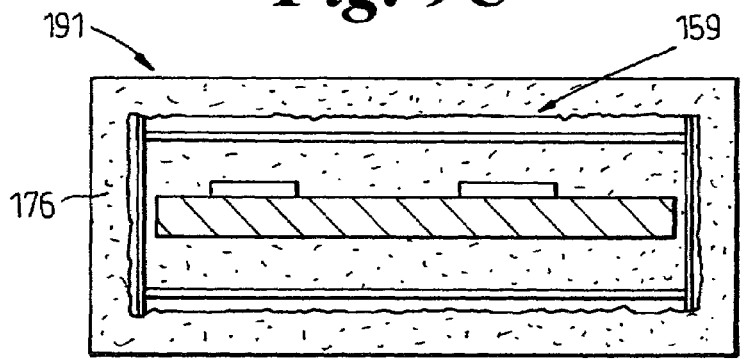
FIG. 10 shows another preferred embodiment of the invention.

To produce the module 159 of FIGS. 8 and 10 the sheets 164, 166, 168, 172, and the PCB 160 are held in place with their relative positions established and the epoxy polymer material 162 and 176 (which comprises the same black epoxy) is injected between the PCB 160 and the glass plates, and around the glass plates to form the internal encapsulant 162 and the external encapsulant 176. The expoxy then sets.

FIG. 11 shows schematically a manufacturing apparatus 199 comprising positioning rig 200, expoxy dispense nozzles 202, an epoxy dispense system 204, a positioning rig control system 206, and a control processor 208. The control processor controls the movement and operation of the positioning rig 200 and the epoxy dispense system 204. Mould walls 210 are used to define the outer surfaces of the block 191 of FIG. 10.

It may be necessary to form the module 159 of FIG. 8 first, before encapsulating that module with epoxy to create the block 191 of FIG. 10.

When forming the module 159 there may be tamper-evident sheet support surfaces, or plates, provided to support the tamper-evident sheet (e.g. thin glass sheet) laterally as the epoxy or other encapsulant is introduced between the electronic component and the tamper-evident sheet. The support surface and the tamper-evident sheet may be in face-to-face contact as the encapsulant is injected/introduced. This enables thinner sheets of glass or other tamper-evident material to be used than would otherwise be the case since they do not have to withstand the lateral forces applied by the encapsulant unaided. The support surfaces may remain in contact with the face of the tamper-evident sheet whilst the epoxy/encapsulant beneath the sheet cures (this can also cause stress/strain in the sheet). The temperature of the module 159 and the support surfaces may be controlled during cooling of the encapsulant, for example to avoid too-rapid cooling which may put too great a strain on the thin tamper-evident sheet: in order to avoid thermal shock from breaking the tamper-evident sheet.

The dispense nozzles 202 may be movable. There may be some dispense nozzles which are used to form the module 159, and some that are used to introduce the material of the encapsulant 176.

FIG. 11 shows a possible advantageous feature. One or more of the sheets is 164 to 170 may have a through hole or holes 212 extending through them which allow epoxy under pressure to pass through (e.g. from between the PCB 160 and the plate 164 to the outside of the plate 164). This may help to key the glass plate to the body of epoxy that is beneath it. It also alleviates the need to be too precise in the amount of epoxy that is pumped in, and the flow rate of epoxy, since the hole(s) effectively provide an overflow escape route for excess epoxy. FIG. 11 shows schematically at 214 such flowed-through epoxy which effectively become patches of epoxy on the outer side of the glass sheets. Walls 210 may have such epoxy-escape channels.

Alternatively another excess epoxy escape channel mechanism may be provided to remove the need to control the volume and rheological properties of the epoxy too closely.

The glass plates may be held relatively imprecisely in position, possibly with a degree of movement in their position. This may be used to accommodate encapsulant-injection problems.

It will be appreciated that the PCB may be exposed to conditions before its in-situ use in an electronic device, when the electronic device is itself in its final phase of use, which would be outside of the parameters set for triggering an attack alarm. For example if a device is left in an unheated warehouse it could get as cold as −20° C., and a device may be vibrated and re-orientated during transport. For this reason the PCB, or the PIC chip, could have an activation trigger which can be activated when the device is ready for use, after unusual installation conditions have already occurred.

It will also be appreciated that one business model for using the invention is that a Trusted Organisation (someone who is likely to be believed) may allow a customer, person or company to take possession of one of their Trusted Clock Modules on condition that they do not tamper with it, and the customer uses the Trusted Clock Module to timestamp documents. Periodically (e.g. once every year or every 6 months) the Trusted Organisation may inspect the Trusted Clock Module for signs of tampering and if no sign is found the data or documents timestamped by that Trusted Clock Module in the foregoing period can be trusted to have the correct timestamp. If the Trusted Clock Module is found to have a sign consistent with tampering then the timestamps that it has made since it was last checked may be suspect. Some action may be taken against a customer who has permitted their module to be tampered with, or some warning given to them.

Of course, the Trusted Clock Module could be inspected or investigated for signs of tampering at any time: it is not necessary to wait for the predetermined pre-planned inspection times. Indeed, there may be no pre-scheduled inspection timetable: the module could simply be checked for tampering by a Trusted Person/the Trusted Organisation upon demand.

It will also be appreciated that a network, such as a LAN or WAN, could share a Trusted Clock Module without needing Internet access to it.

Figure 12A:
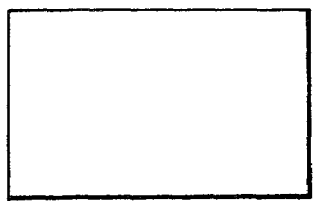
FIGS. 12A and 12B show respectively an uncompromised PCI card and in accordance with the invention and a PCI card that has been attacked with a laser drill.
Figure 12B:
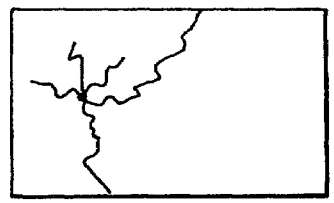

FIG. 12A shows schematically an untampered PCI card, and FIG. 12B shows a PCI card in accordance with the invention after a laser drill has been used on it. The cracks in the sheet glass of the card of FIG. 12B are clearly, and immediately readily, visible.

It will be appreciated that the frangible sheet material should be as frangible as practicable, so long as it can withstand the manufacturing process for the module. In the case of a sheet of glass, this means that it should be as thin as possible, consistent with being handleable and consistent with it being possible to fabricate the modules without breaking it.

What is claimed is:

1. A tamper-evident timestamping module comprising a trusted clock embedded in an encapsulant matrix including chemical signature molecules, the matrix being sandwiched between two frangible sheets of frangible material, said sheets being such that they will crack or break if an attempt is made to drill or cut through them with a laser drill.

2. A module according to claim 1 which comprises a PCI card.

3. A module according to claim 1 wherein said sheets are themselves encapsulated in encapsulant material.

4. A method of manufacturing plural tamper-evident electronic modules, each of the modules being made by steps comprising: including an electronic component and at least one sheet of frangible material that cracks or breaks if an attempt Is made to drill or cut through it with a laser drill after said module is made, each of the modules being made by steps comprising positioning said sheet and said component relative to each other so that in all of the plural modules the relative position of said sheet and said component of the plural modules differ from each other, and encapsulating said component and said sheet in encapsulant material.

5. The method of claim 4 wherein said encapsulant is a dark colour and the method includes the step of obscuring from view said sheet with encapsulant.

6. The method of claim 4 comprising introducing an imprecisely controlled amount of encapsulant between at least one of (i) the space between said component and said sheet, (ii) the space between said component and a module-surface defining wall.

7. The method of claim 6 comprising providing flow passageways from at least one of: (i) said space between said component and said sheet; (ii) said space between said sheet and said module-surface defining mould wall, such that fluid encapsulant can flow from the space (i) and/or (ii) during the encapsulation.

8. The method of claim 7 wherein said sheet of each module has at least one hole or through passage in it.

9. The method of claim 4, wherein for each of the modules, further including embedding a trusted clock in an encapsulant matrix including chemical signature molecules and placing the thin sheet and reflective surface over the encapsulant matrix.

10. The method of claim 4, wherein for each of the modules: further including embedding a trusted clock in an encapsulant matrix including chemical signature molecules and sandwiching the encapsulant matrix between a pair of the thin sheets and a pair of the reflective surfaces.

* * * * *